United States Patent
Amai et al.

(10) Patent No.: US 7,803,230 B2
(45) Date of Patent: Sep. 28, 2010

(54) SUBSTRATE CLEANING APPARATUS, SUBSTRATE CLEANING METHOD, AND MEDIUM FOR RECORDING PROGRAM USED FOR THE METHOD

(75) Inventors: Masaru Amai, Tokyo-To (JP); Kenji Sekiguchi, Nirasaki (JP); Takehiko Orii, Nirasaki (JP); Hiroki Ohno, Nirasaki (JP); Satoru Tanaka, Tosu (JP); Takuya Mori, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 964 days.

(21) Appl. No.: 10/593,560
(22) PCT Filed: Apr. 5, 2005
(86) PCT No.: PCT/JP2005/006675
§ 371 (c)(1),
(2), (4) Date: Sep. 20, 2006
(87) PCT Pub. No.: WO2005/098919
PCT Pub. Date: Oct. 20, 2005

(65) Prior Publication Data
US 2007/0175501 A1 Aug. 2, 2007

(30) Foreign Application Priority Data
Apr. 6, 2004 (JP) ............................. 2004-112179

(51) Int. Cl.
*B08B 7/00* (2006.01)
(52) U.S. Cl. ................ 134/6; 134/21; 134/26; 134/30; 134/32; 134/33; 134/34; 134/36; 134/37; 134/42; 134/94.1; 134/99.2; 134/103.2; 134/147; 134/153; 15/77; 15/88.2; 15/88.3
(58) Field of Classification Search ............ 134/6, 134/21, 26, 30, 32, 33, 34, 36, 37, 42, 94.1, 134/99.2, 103.2, 147, 153, 902; 15/77, 88.2, 15/88.3
See application file for complete search history.

(56) References Cited

U.S. PATENT DOCUMENTS 6,059,891 A * 5/2000 Kubota et al. ............. 134/18
(Continued)

FOREIGN PATENT DOCUMENTS

JP 07-169725 7/1995
(Continued)

OTHER PUBLICATIONS

Notification of Transmittal of Translation of the International preliminary Report on Patentability (Form PCT/IB/338) in connection with PCT/JP2005/006675, dated Jan. 2004.
(Continued)

*Primary Examiner*—Sharidan Carrillo
(74) *Attorney, Agent, or Firm*—Smith, Gambrell & Russell, LLP

(57) ABSTRACT

In a substrate cleaning method and a substrate cleaning method according to the present invention, a brush 3 is brought into contact with a substrate W while rotating the same, and a cleaning position Sb of the brush 3 is moved relative to the substrate W from a center part of the substrate W toward a peripheral part thereof. A process fluid formed of liquid droplets and a gas is sprayed by a two-fluid nozzle 5 onto the substrate W, and a cleaning position Sn of the two-fluid nozzle 5 is moved relative to the substrate W from a center part of the substrate W toward a peripheral part thereof. During the movement of the cleaning position Sb of the brush 3 from the center part of the substrate W toward the peripheral part thereof, the cleaning position Sb of the two-fluid nozzle is positioned nearer to a center $P_0$ than the cleaning position Sb of the brush 3. Since contaminations of the brush are prevented from adhering again to the wafer, it can be avoided that the wafer W is contaminated.

10 Claims, 7 Drawing Sheets

U.S. PATENT DOCUMENTS

| | | | |
|---|---|---|---|
| 6,115,867 A * | 9/2000 | Nakashima et al. | 15/77 |
| 6,151,744 A * | 11/2000 | Ohtani et al. | 15/88.2 |
| 6,286,525 B1 | 9/2001 | Nishimura et al. | |
| 6,643,882 B1 * | 11/2003 | Sotozaki et al. | 15/77 |
| 6,842,932 B2 * | 1/2005 | Ishihara | 15/77 |
| 2002/0050015 A1 * | 5/2002 | Oh et al. | 15/77 |
| 2002/0059686 A1 * | 5/2002 | Uemukai et al. | 15/77 |
| 2002/0189641 A1 * | 12/2002 | Sato | 134/6 |
| 2003/0079764 A1 * | 5/2003 | Hirose et al. | 134/95.3 |
| 2003/0178047 A1 * | 9/2003 | Hirae | 134/26 |

FOREIGN PATENT DOCUMENTS

| | | |
|---|---|---|
| JP | 11-040530 | 2/1999 |
| JP | 2003-001199 | 1/2003 |
| JP | 2003-203892 | 7/2003 |
| JP | 2003-275696 | 9/2003 |
| JP | 2003-347264 | 12/2003 |

OTHER PUBLICATIONS

International Preliminary Report on Patentability (Form PCT/IB/373) in connection with PCT/JP2005/006675, dated Jan. 2004.

Translation of Written Opinion of the International Searching Authority (Form PCT/ISA/237) in connection with PCT/JP2005/006675, dated Jan. 2004.

Supplementary European Search Report.

* cited by examiner

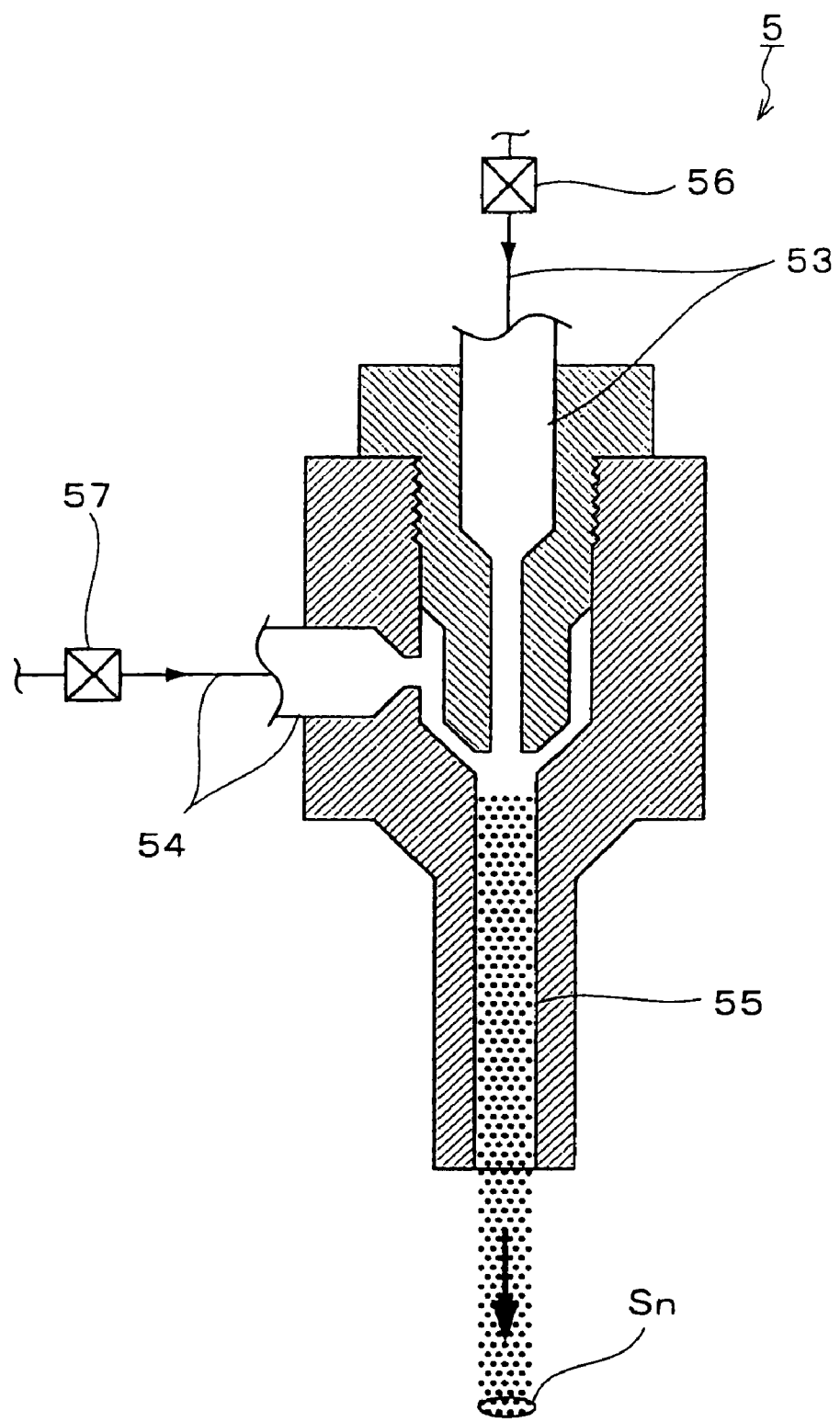
F I G. 3

SUBSTRATE CLEANING APPARATUS, SUBSTRATE CLEANING METHOD, AND MEDIUM FOR RECORDING PROGRAM USED FOR THE METHOD

FIELD OF THE INVENTION

The present invention relates to a substrate cleaning apparatus, a substrate cleaning method, and a medium for recording a program used for the method, that are for use in a cleaning process for removing contaminations adhering to a semiconductor substrate or the like.

BACKGROUND ART

When manufacturing a semiconductor device, a cleaning process is performed to a semiconductor wafer (referred to as "wafer" below) by using a cleaning liquid, such as a chemical liquid and a deionized water, to remove contaminations adhering to the wafer, such as particles, organic contaminations, and metal impurities. A scrubbing method has been known as such a cleaning process in which a brush is brought into contact with a wafer to scrub the same (see, for example, JP2003-332287A). The scrubbing process using a brush is particularly carried out for cleaning a rear surface of a wafer on which a device is not formed. Another method for cleaning a wafer has been known in which a cleaning liquid is made into liquid droplets with the use of a two-fluid nozzle, and the liquid droplets are sprayed onto the wafer (see, for example, JP2003-197597A).

In these conventional cleaning processes, when a brush is used for cleaning wafers for a plurality of times, the brush is contaminated. Then, the contaminations adhering to the brush adhere again to the wafer, so that the wafer cannot be sufficiently cleaned. In particular, under conditions that patterns of a semiconductor device become finer, the following problem may occur. That is, when a rear surface of a wafer is held by an electrostatic chuck at a dry etching step, for example, unless particles adhering to the rear surface are fully removed, the particles might cause a defocus at a succeeding lithography step.

The object of the present invention is to provide a substrate cleaning apparatus, a substrate cleaning method, and a medium for recording a program used for the method, that are capable of preventing a wafer contamination caused by a contaminated brush.

SUMMARY OF THE INVENTION

In order to achieve the above object, the present invention provides a substrate cleaning apparatus for cleaning a substrate, comprising:
a spin chuck that rotates a substrate;
a brush that comes into contact with the substrate to clean the same; and
a two-fluid nozzle that sprays liquid droplets onto the substrate; wherein
the brush and the two-fluid nozzle are configured to move radially outward relative to a center of the substrate, while the two-fluid nozzle is kept nearer to the center of the substrate than the brush.

According to the substrate cleaning apparatus, the liquid droplets are sprayed onto the surface with which the brush has been in contact. Thus, even when contaminations of the brush adhere to the wafer, the contaminations adhering to the wafer can be removed.

This apparatus may further comprise:
a brush support arm that supports the brush;
a two-fluid nozzle support arm that supports the two-fluid nozzle; and
a controller configured to control movements of the brush support arm and the two-fluid nozzle support arm.

Preferably, the controller controls the movements of the respective support arms such that a moving speed of the two-fluid nozzle is higher than a moving speed of the brush.

Preferably, the controller controls the brush support arm and the two-fluid nozzle support arm to move in directions opposite to each other.

Preferably, the controller separates the brush from the substrate at a peripheral part thereof, and thereafter moves the two-fluid nozzle to a position above a portion with which the brush had been in contact immediately before the brush was separated therefrom.

The apparatus may further comprise:
a second two-fluid nozzle that sprays liquid droplets onto the substrate;
a support arm that supports and moves the brush, the two-fluid nozzle, and the second two-fluid nozzle, such that the brush is positioned farther away from the center of the substrate than the two-fluid nozzle, and is positioned ahead of the second two-fluid nozzle in a rotational direction of the substrate; and
a controller configured to control a movement of the support arm.

The controller may control the movements of the respective support arms such that, while spraying liquid droplets from the two-liquid nozzle onto the substrate, the brush is brought into contact with the center of the substrate to start to move radially outward the substrate, and thereafter, the two-fluid nozzle is positioned above the center of the substrate to move radially outward the substrate.

Preferably, the controller controls the movements of the respective support arms such that a moving speed of the brush relative to the substrate and a moving speed of the two-fluid nozzle relative to the substrate are reduced, as the brush and the nozzle move radially outward from the center of the substrate.

In addition, the present invention provides a substrate cleaning method for cleaning a substrate by bringing a brush into contact with a substrate while rotating the same, and by spraying liquid droplets from a two-fluid nozzle onto the substrate, wherein
the brush and the two-fluid nozzle are moved radially outward relative to a center of the substrate, while a cleaning position of the two-fluid nozzle is kept nearer to the center of the substrate than a cleaning position of the brush.

In this method, the brush may be brought into contact with the center of the substrate, while spraying liquid droplets from the two-fluid nozzle onto the substrate, and the cleaning position of the brush is started to move radially outward the substrate, and thereafter the cleaning position of the two-fluid nozzle may be positioned above the center of the substrate to move radially outward the substrate.

In this method, after the brush is separated from the substrate at a peripheral part thereof, the cleaning position of the two-fluid nozzle may be moved to a position above a portion with which the brush had been in contact immediately before the brush was separated therefrom.

The cleaning position of the brush and the cleaning position of the two-fluid nozzle may be moved in directions opposite to each other.

Preferably, a moving speed of the cleaning position of the brush relative to the substrate and a moving speed of the cleaning position of the two-fluid nozzle relative to the substrate are reduced, as the cleaning position of the brush and the cleaning position of the nozzle move radially outward from the center of the substrate.

Preferably, a moving speed of the cleaning position of the two-fluid nozzle relative to the substrate is higher than a moving speed of the cleaning position of the brush relative to the substrate.

Furthermore, the present invention provides a medium for recording a program that allows a computer to execute the procedures of bringing a brush into contact with a substrate while rotating the same, and spraying liquid droplets from a two-fluid nozzle onto the substrate, wherein the brush and the two-fluid nozzle are moved radially outward relative to a center of the substrate, while a cleaning position of the two-fluid nozzle is kept nearer to the center of the substrate than a cleaning position of the brush.

In this medium, the program may allow a computer to execute the procedure of bringing the brush into contact with the center of the substrate, while spraying liquid droplets from the two-fluid nozzle onto the substrate, and starting the cleaning position of the brush to move radially outward the substrate, and thereafter positioning the cleaning position of the two-fluid nozzle above the center of the substrate to move the same position radially outward the substrate.

The program may allow a computer to execute the procedures of separating the brush from the substrate at a peripheral part thereof, and thereafter moving the cleaning position of the two-fluid nozzle to a position above a portion with which the brush had been in contact immediately before the brush was separated therefrom.

The program may allow a computer to execute the procedure of moving the cleaning position of the brush and the cleaning position of the two-fluid nozzle in directions opposite to each other.

The program may allow a computer to execute the procedure of reducing a moving speed of the cleaning position of the brush relative to the substrate and a moving speed of the cleaning position of the two-fluid nozzle relative to the substrate, as the cleaning position of the brush and the cleaning position of the nozzle move radially outward from the center of the substrate.

The program may allow a computer to execute the procedure of controlling a moving speed of the cleaning position of the two-fluid nozzle relative to the substrate to be higher than a moving speed of the cleaning position of the brush relative to the substrate.

According to the present invention, a brush and a two-fluid nozzle are disposed, and liquid droplets are sprayed by the two fluid nozzle onto an area nearer to a center of a substrate than a cleaning position of the brush. As a result, even when contaminations of the brush adhere to a wafer, the contamination adhering to the wafer can be removed therefrom.

BRIEF DESCRIPTION OF THE DRAWINGS

FIG. 3 is a longitudinal sectional view of a two-fluid nozzle;

PREFERRED EMBODIMENTS OF THE INVENTION

Figure 1:
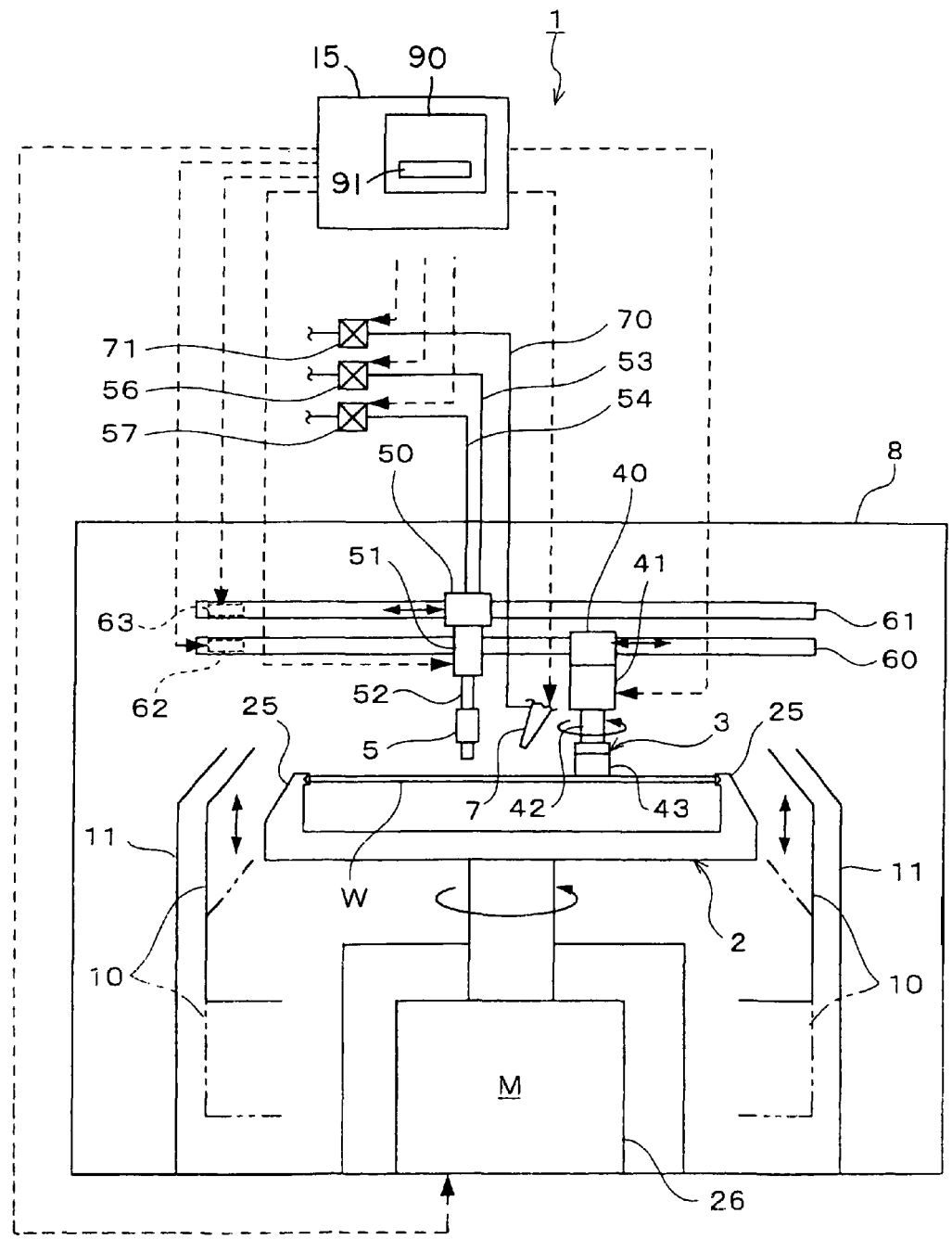
FIG. 1 is a side view of a basic structure of a substrate cleaning apparatus in one embodiment according to the present invention.
Figure 2:
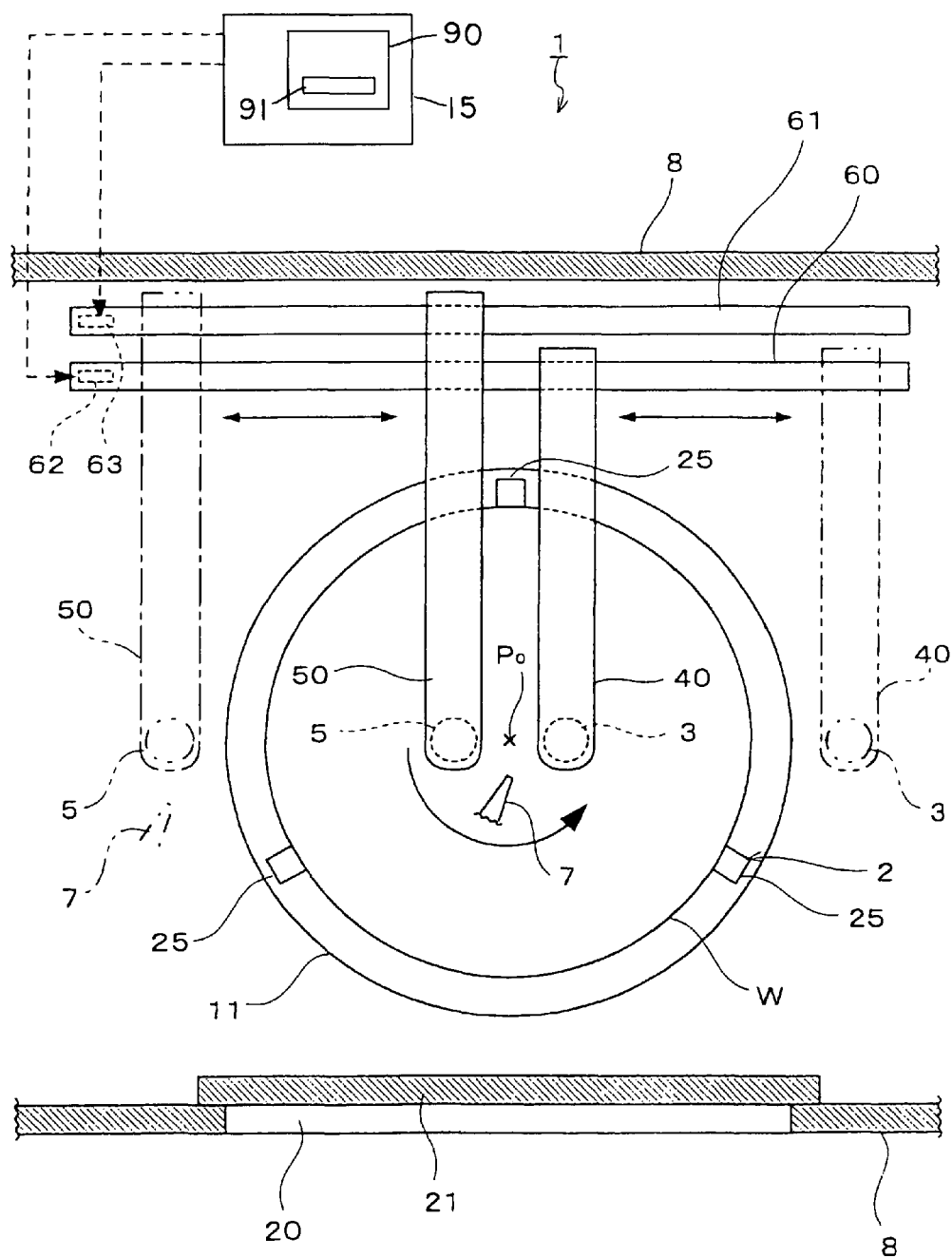
FIG. 2 is a plan view of the basic structure of substrate cleaning apparatus in the embodiment according to the present invention.

Preferred embodiments of the present invention will be described hereinbelow based on a substrate cleaning apparatus for cleaning a rear surface (surface on which a semiconductor device is not formed) of a wafer W as a substrate. As shown in FIG. 1, a substrate cleaning apparatus 1 in one embodiment includes a spin chuck 2 that holds a substantially disk-shaped wafer W in substantially a horizontal direction, a brush 3 that comes into contact with an upper surface (rear surface) of the wafer W to clean the wafer W, and a two-fluid nozzle 5 that sprays onto the upper surface of the wafer W liquid droplets obtained by mixing a cleaning liquid and a gas. Further, there is disposed a supply nozzle 7 that supplies a cleaning liquid such as deionized water to the upper surface of the wafer W. The spin chuck 2, the brush 3, the two-fluid nozzle 5, and the supply nozzle 7 are contained in a chamber (vessel) 8 capable of being hermetically sealed. The chamber 8 includes an inner cup 10 and an outer cup 11 that surround a circumference of the wafer W held by the spin chuck 2. The inner cup 10 is capable of vertically moving inside the outer cup 11. By elevating the inner cup 10, the circumference of the wafer W can be surrounded by the inner cup 10. By lowering the inner cup 10, the circumference of the wafer W can be surrounded by the outer cup 11. As shown in FIG. 2, the chamber 8 is provided with an opening 20 through which the wafer W is loaded and unloaded, and a shutter 21 that opens and closes the opening 20.

As shown in FIGS. 1 and 2, the respective parts of the substrate cleaning apparatus 1 are controlled based on instructions by a controller 15 having a control computer 90 with a recording medium 91 in which a control software is recorded. The recording medium 91 may be immovably mounted on the control computer 90. Alternatively, the recording medium 91 may be removably mounted on a reader disposed on the control computer 90, and may be read by the reader. In the most typical case, the recording medium 91 is a hard disk drive in which a control software has been installed by an operator of a manufacturing company of a substrate cleaning apparatus. In another case, the recording medium 91 is a removable disk such as a CD-ROM or DVD-ROM in which a control software is written. Such a removable disk is read by an optical reader disposed on the control computer 90. The recording medium 91 may either be a RAM (random access memory) type or a ROM (read only memory) type. Alternatively, the recording medium 91 may be a cassette type ROM or a memory card. In short, any medium known in the technical field of a computer can be employed as the recording medium 91. In a factory where a plurality of substrate cleaning apparatuses are placed, a control software may be stored in an executive computer that comprehensively controls the control computers 90 in the respective substrate cleaning apparatuses. In this case, the respective substrate cleaning apparatuses are operated by the executive computer via communication lines so as to execute a predetermined substrate cleaning process.

The spin chuck 2 is provided on its upper part with three holding members 25. The holding members 25 are adapted to contact a peripheral edge of the wafer W at three points to surround the peripheral edge of the wafer W, so that the wafer W can be held by the three holding members 25. As shown in FIG. 1, a motor 26 is disposed below the spin chuck 2 to rotate the same about a vertical rotational center axis. The spin chuck 2 is driven in rotation by the motor 26. Along with the spin chuck 2, the wafer W is rotated about its center $P_0$ in substantially a horizontal plane. Driving of the motor 26 is controlled by the controller 15.

As shown in FIG. 1, a brush support arm 40 that supports the brush 3 is disposed above the wafer W supported by the spin chuck 2. An elevating and rotating mechanism 41 is fastened to an end lower surface of the brush support arm 40. The brush 3 is fixed on a lower end of an elevating and rotating shaft 42 which extends downward from the elevating and rotating mechanism 41. The elevating and rotating shaft 42 can be vertically moved and rotated by the elevating and rotating mechanism 41. Thus, the brush 3 can be moved upward and downward to a given height, and can be rotated. By applying a suitable thrust force to the elevating and rotating shaft 42 in the up and down directions, the elevating and rotating mechanism 41 is capable of pressing the brush 3 onto the upper surface of the wafer W supported by the spin chuck 2 at a given contact pressure. Driving of the elevating and rotating mechanism 41 is controlled by the controller 15.

The brush 3 has a columnar brush body 43. As the brush body 43, there may be used a substantially columnar sponge made of a resin or the like, a hard brush having hard nylon bristles, a soft brush having soft mohair bristles, and so on, depending on the kind of a cleaning process.

A two-fluid nozzle support arm 50 that supports the two-fluid nozzle 5 is disposed above the wafer W supported by the spin chuck 2. An elevating mechanism 51 is fastened to an end lower surface of the two-fluid nozzle support arm 50. The two-fluid nozzle 5 is fixed on a lower end of an elevating shaft 52 which extends downward from the elevating mechanism 51. The elevating shaft 52 can be vertically moved by the elevating mechanism 51. Thus, the two-fluid nozzle 5 can be moved upward and downward to a given height. Driving of the elevating mechanism 51 is controlled by the controller 15.

As shown in FIG. 3, the two-fluid nozzle 5 is of an internal mixing type, including a gas supply channel 53 that supplies a gas such as nitrogen ($N_2$) into the two-fluid nozzle 5; a liquid supply channel 54 that supplies, e.g., a deionized water as a cleaning liquid into the two-fluid nozzle 5; and a delivery channel 55 that delivers outside the two-fluid nozzle 5 droplets of the cleaning liquid formed in the two-fluid nozzle 5. The nitrogen gas supplied through the gas supply channel 53 and the deionized water supplied through the liquid supply channel 54 are mixed in the interior of the two-fluid nozzle 5. As the result of mixture of the deionized water and the nitrogen gas, the deionized water is made into numbers of particulate liquid droplets, and the liquid droplets pass through the delivery channel 55, while being accelerated by the nitrogen gas. The delivery channel 55 is arranged substantially vertically so as to spray the liquid droplets downward from a lower end thereof. On-off valves 56 and 57 are disposed on the gas supply channel 53 and the liquid supply channel 54, respectively. On-off operations of the on-off valves 56 and 57 are respectively controlled by the controller 15 shown in FIG. 1.

As shown in FIG. 2, a proximal end of the brush support arm 40 and a proximal end of the two-fluid nozzle support arm 50 are supported by guide rails 60 and 61 to be capable of moving therealong, respectively. The guide rails 60 and 61 are substantially horizontally arranged in an opposite side of the opening 20 relative to the outer cup 11. The brush support arm 40 and the two-fluid nozzle support arm 50 are capable of moving in parallel across over the outer cup 11.

A driving mechanism 62 is disposed for moving the brush support arm 40 along the guide rail 60. A driving mechanism 63 is disposed for moving the two-fluid nozzle support arm 50 along the guide rail 61. Driving of the driving mechanisms 62 and 63 is controlled by the controller 15.

On the basis of the control of the driving mechanisms 62 and 63 by the controller 15, the brush support arm 40 is moved between a position above the wafer W and a right side position of the outer cup 11 (rightward seen from the opening 20 in FIG. 2). The two-fluid nozzle support arm 50 is moved between a position above the wafer W and a left side position of the outer cup 11 (leftward seen from the opening 20 in FIG. 2). A moving speed and a position of the brush support arm 40, and a moving speed and a position of the two-fluid nozzle support arm 50 can be respectively, suitably changed by controlling the driving mechanism 62 and the driving mechanism 63.

In accordance with the movements of the brush support arm 40 and the two-fluid nozzle support arm 50, the brush 3 and the two-fluid nozzle 5 can move relative to the wafer W supported by the spin chuck 2 from a center part of the wafer W toward a peripheral part thereof. The brush 3 moves between a position above the center part of the wafer W and a position on the right side of the outer cup 11. The two-fluid nozzle 5 moves between a position above the center part of the wafer W and a position on the left side of the outer cup 11. By changing the respective moving speeds of the brush support arm 40 and the two-fluid nozzle support arm 50, the respective moving speeds of the brush 3 and the two-fluid nozzle 5 can be suitably changed.

Figure 4:
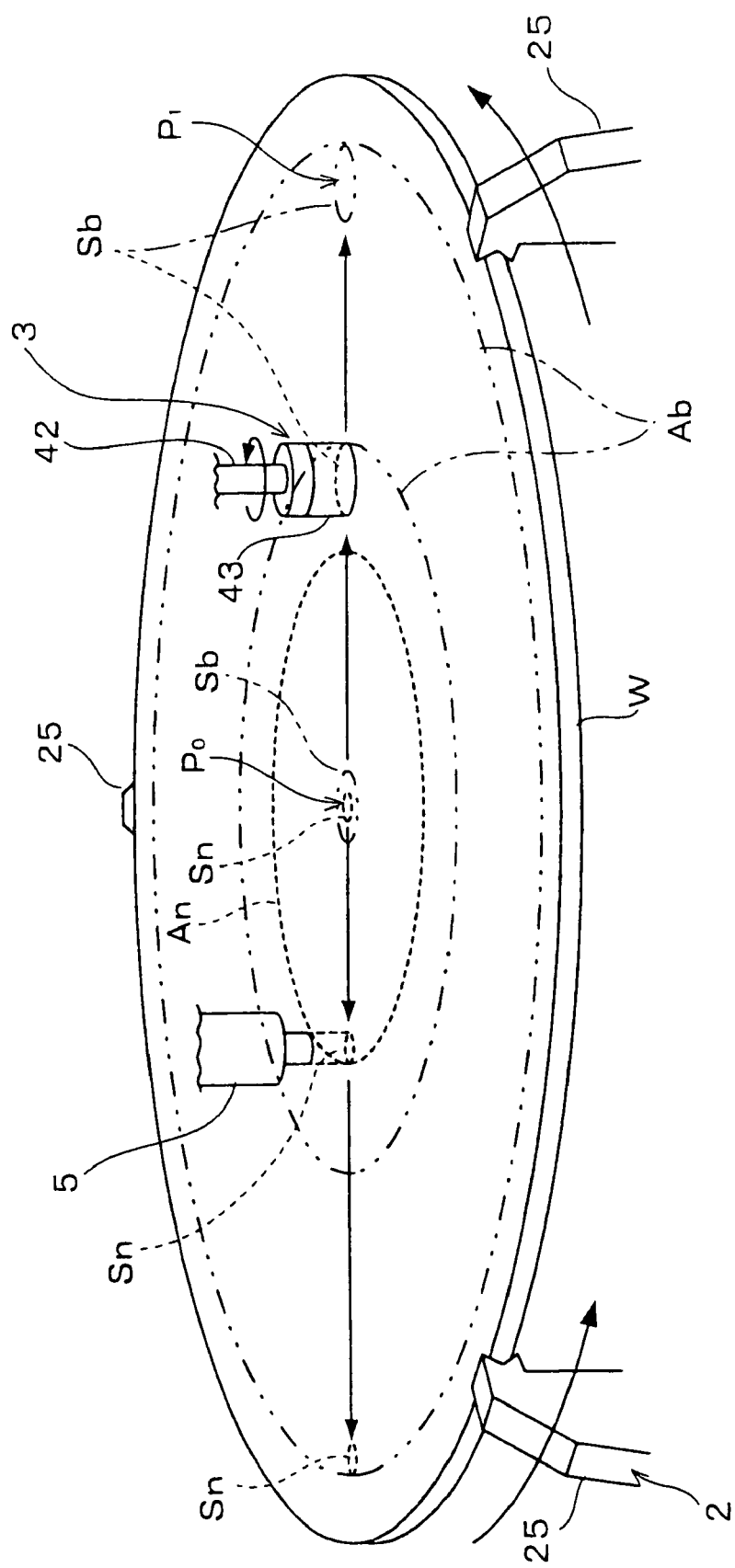
FIG. 4 is a view of assistance in explaining movements of a cleaning position of a brush and a cleaning position of the two-fluid nozzle.

For example, when the wafer W is sent to the spin chuck 2, the brush 3 and the brush support arm 40 are drawn to the right side of the outer cup 11, while the two-fluid nozzle 5 and the two-fluid nozzle support arm 50 are drawn to the left side of the outer cup 11. When the wafer W is cleaned, as shown in FIG. 4, while the wafer W is rotated by the spin chuck 2, the brush 3 in contact with the wafer W is moved rightward from the center $P_0$ of the wafer W. That is, a cleaning position Sb of the brush 3 is moved from the center $P_0$ of the rotating wafer W toward the right-side peripheral part thereof. Thus, it is possible to uniformly scrub a substantially circular area Ab a radius of which is a distance between the center $P_0$ and the cleaning position Sb of the brush 3, while the area Ab enlarges. During the cleaning operation by the brush 3, the two-fluid nozzle 5 spraying the liquid droplets is moved leftward from the center $P_0$ of the wafer W. That is, a cleaning position Sn of the two-fluid nozzle 5 spraying the liquid droplets is moved from the center $P_0$ of the rotating wafer W toward the left-side peripheral part thereof. Thus, it is possible to uniformly spraying the liquid droplets onto a substantially circular area An a radius of which is a distance between the center $P_0$ and the cleaning position Sn of the two-fluid nozzle 5, while the area An enlarges. While the two-fluid nozzle 5 is moved from the center $P_o$ toward the peripheral part, the cleaning position Sn of the two-fluid nozzle 5 is constantly kept nearer to the center $P_0$ of the wafer W than the cleaning position Sb of the brush 3. Due to this arrangement, the wafer W can be cleaned by spraying the liquid droplets onto the area Ab with which the brush 3 has been in contact. Therefore, even when contaminations of the brush 3 adhere to the upper surface of the wafer W, the contaminations adhering to the wafer W can be removed by the liquid droplets sprayed from the two-fluid nozzle 5, the contaminations can be reliably removed from the wafer W. In addition, since the liquid droplets that flow from the cleaning potion Sn of the two-fluid nozzle 5 toward the periphery of the wafer W are supplied to the brush 3, the contaminations adhering to the brush 3 can be washed away by the liquid droplets. When the two-fluid nozzle support arm 50, the two-fluid nozzle 5, and the cleaning position Sn are configured to move in a direction (rightward) opposite to a direction (leftward) in which the brush support arm 40, the brush 3, and the cleaning position Sb are moved, a collision between the brush support arm 40 and the two-fluid nozzle support arm 50 can be avoided.

In order to prevent that the brush 3 collides with the holding members 25 of the spin chuck 2 at the peripheral part of the wafer W, a cleaning operation by the brush 3 is performed within an area nearer to the center $P_0$ than the peripheral edge of the wafer W. That is, when the cleaning position Sb of the brush 3 reaches a position $P_1$, which is slightly spaced apart from the peripheral edge of the wafer W, the brush 3 is raised and separated from the wafer W.

A moving speed of the cleaning position Sb of the brush 3, i.e., a speed at which the brush 3 is moved rightward relative to the center $P_0$ of the wafer W, is preferably reduced, as the brush 3 approaches the peripheral part of the wafer W from the center part thereof. In this manner, a performance of the brush 3 to remove contaminations can be improved. Similarly, a moving speed of the cleaning position Sn of the two-fluid nozzle 5, i.e., a speed at which the two-fluid nozzle 5 is moved leftward relative to the center $P_0$ of the wafer W, is preferably reduced, as the two-fluid nozzle 5 approaches the peripheral part of the wafer W from the center part thereof. In this manner, a performance of the two-fluid nozzle 5 to remove contaminations can be improved.

More preferably, the two-fluid nozzle 5 is moved at a speed higher than that of the brush 3, so that a moving speed of the cleaning position Sn of the two-fluid nozzle 5 is higher than that of the cleaning position Sb of the brush 3. In this manner, a cleaning throughput of the wafer W by the brush 3 and the two-fluid nozzle 5 can be enhanced. That is, after the brush 3 is moved rightward from the center $P_0$, the two-fluid nozzle 5 is moved to a position above the center $P_0$, and then a cleaning operation by the two-fluid nozzle 5 is started by spraying the liquid droplets from the two-fluid nozzle 5 onto the center $P_0$. At the same time when the brush 3 is separated from the wafer W, the cleaning position Sn of the two-fluid nozzle 5 is moved to a portion with which the brush 3 had been in contact before the brush 3 was separated therefrom, so as to clean the peripheral part of the wafer W. Namely, the cleaning operation by the two-fluid nozzle 5 is started following to the cleaning operation by the brush 3, and is finished following thereto. However, since the cleaning position Sn of the two-fluid nozzle 5 is moved at a speed higher than that of the cleaning position Sb of the brush 3, it is possible to reduce a difference between a cleaning completion timing of the brush 3 and a cleaning completion timing of the two-fluid nozzle 5. Accordingly, a time period required for cleaning the wafer W can be decreased, which improves a throughput in the cleaning operation.

The supply nozzle 7 shown in FIG. 1 is driven by a driving mechanism, not shown, to be movable between a position outside the outer cup 11 and a position above the wafer W held by the spin chuck 2. A cleaning liquid supply channel 70 that supplies a cleaning liquid is connected to the supply nozzle 7. An on-off valve 71 is disposed on the cleaning liquid supply channel 70.

As shown in FIG. 1, driving of the motor 26, driving of the elevating and rotating mechanism 41, driving of the elevating mechanism 51, on-off operations of the on-off valves 56 and 57, driving of the driving mechanism 62 and the driving mechanism 63, driving of the driving mechanism (not shown) of the supply nozzle 7, an on-off operation of the on-off valve 71, and so on are respectively controlled based on control instructions of the controller 15.

Next, a cleaning method of the wafer W by using the substrate cleaning apparatus 1 as structured above is described. As shown in FIGS. 1 and 2, the following operations are controlled by the controller 15 having the control computer 90 with the recording medium 91 in which a control software is recorded.

First, the wafer W which has not been cleaned yet is loaded into the chamber 8 by a convey arm, not shown, and, as shown in FIG. 1, the wafer W is sent to the spin chuck 2. At this time, the wafer W is sent to the spin chuck 2 such that a front surface (surface in which patterns are formed) faces downward while a rear surface thereof faces upward. In order to send the wafer W to the spin chuck 2, the brush 3 and the two-fluid nozzle 5 are previously retracted outside the outer cup 11, as indicated by the two-dot chain lines shown in FIG. 2.

After the wafer W is sent to the spin chuck 2, the spin chuck 2 is driven in rotation by the motor 26 shown in FIG. 1 so as to start a rotation of the wafer W. The supply nozzle 7 is moved above the wafer W, and a cleaning liquid such as deionized water is supplied to the center $P_0$ on the upper surface of the rotating wafer W. The cleaning liquid is dispersed due to the centrifugal force over all the upper surface of the wafer W, so that a liquid film of the cleaning liquid is formed thereon.

Following to the formation of the liquid film on the upper surface of the wafer W, the brush support arm 40 is moved above the wafer W to move the brush 3 above the center $P_0$ of the wafer W shown in FIG. 4. The brush 3 is rotated and lowered by the elevating and rotating mechanism 41 to bring a lower surface of the brush body 43 into contact with the center $P_0$ of the wafer W. Then, the cleaning position Sb of the brush 3 is positioned at the center $P_0$ of the wafer W.

Next, while the brush 3 is in contact with the rotating wafer W, the brush support arm 40 is moved in parallel toward the right side of the wafer W to move the brush 3 rightward the wafer W. That is, the cleaning position Sb of the brush 3 is moved from the center $P_0$ of the wafer W toward the right-side peripheral part of the wafer W. Thus, the brush 3 cleans the upper surface of the wafer W, while the area Ab cleaned by the brush 3 is enlarged.

On the other hand, after the brush 3 is moved rightward from the center $P_0$, the two-fluid nozzle support arm 50 is moved above the wafer W to position the two-fluid nozzle 5 above the center $P_0$. Then, spraying of the liquid droplets is started under conditions that the cleaning position Sn of the two-fluid nozzle 5 is positioned at the center $P_0$. When spraying of the liquid droplets is started, the supply of the cleaning liquid from the supply nozzle 7 is stopped, and the supply nozzle 7 is moved outside the outer cup 11. While the liquid droplets are sprayed from the two-fluid nozzle 5 onto the rotating wafer W, the two-fluid nozzle support arm 50 is translated to the left side of the wafer W to move the two-fluid nozzle 5 leftward the wafer W. That is, the cleaning position Sn of the two-fluid nozzle 5 is moved from the center $P_0$ of the wafer W toward the left-side peripheral part of the wafer W. Thus, the two-fluid nozzle 5 cleans the upper surface of the wafer W, while the area An onto which the liquid droplets are sprayed is enlarged. The liquid droplets sprayed from the two-fluid nozzle 5 and the cleaning liquid supplied from the supply nozzle 7 flow toward the periphery of the wafer W due to the centrifugal force caused by the rotation of the wafer W, and run off from the wafer W. The liquids are then received in the outer cup 11 shown in FIG. 1, and are discharged therefrom through a discharge channel, not shown.

While the wafer W is cleaned by moving the two-fluid nozzle 5 from the center $P_0$ of the wafer W toward the peripheral part thereof, the cleaning position Sn of the two-fluid nozzle 5 is constantly kept nearer to the center $P_0$ than the cleaning position Sb of the brush 3, in order that the liquid droplets are sprayed onto the area Ab which has been in contact with the brush 3. Thus, even when contaminations of the brush 3 adhere to the upper surface of the wafer W, the contaminations adhering to the wafer W can be removed by the jet flow of the liquid droplets. Accordingly, the contaminations can be reliably removed from the wafer W.

As described above, when the cleaning operation by the two-fluid nozzle 5 and the cleaning operation by the brush 3 are simultaneously carried out, the supply of the cleaning liquid from the supply nozzle 7 is stopped. This restrains scattering of the cleaning liquid, and thus the wafer W can be suitably cleaned. Although the supply of the cleaning liquid from the supply nozzle 7 is stopped, the liquid droplets of the cleaning liquid sprayed from the two-fluid nozzle 5 are dispersed over the upper surface of the wafer W. Thus, the wafer W can be suitably subjected to the scrubbing process, while the cleaning liquid is supplied to the cleaning position Sb of the brush 3. It is preferable that, while the scrubbed surface has not dried and is still wet, the liquid droplets be sprayed from the two-fluid nozzle 5 onto the scrubbed surface. This enables a reliable removal of contaminations from the wafer W.

It is also preferable that a moving speed of the cleaning position Sb of the brush 3 and a moving speed of the cleaning position Sn of the two-fluid nozzle 5 be gradually reduced, as the positions Sb and Sn approach the peripheral part of the wafer W from the center $P_0$. Then, a performance for removing contaminations can be enhanced. Moreover, it is preferable that the two-fluid nozzle 5 be moved faster than the brush 3, i.e., a moving speed of the cleaning position Sn of the two-fluid nozzle 5 be higher than a moving speed of the cleaning position Sb of the brush 3. This can reduce a time period required for cleaning the wafer W. By increasing a moving speed of the cleaning position Sn of the two-fluid nozzle 5 as compared with a moving speed of the cleaning position Sb of the brush 3, a difference between a distance from the center $P_0$ to the cleaning position Sb and a distance from the center $P_0$ to the cleaning position Sn becomes gradually smaller, as the cleaning position Sb of the brush 3 approaches the peripheral part of the wafer W. At the time when the brush 3 is separated from the wafer W at the position $P_1$, it is preferable that a distance from the center $P_0$ to the cleaning position Sn of the two-fluid nozzle 5 is substantially equal to a distance from the center $P_0$ to the position $P_1$. In this manner, upon completion of the cleaning operation by the brush 3, the cleaning position Sn of the two-fluid nozzle 5 can be rapidly moved to a portion with which the brush 3 had been in contact just before the brush 3 was separated therefrom. Thus, the peripheral part of the wafer W can be promptly cleaned by the two-fluid nozzle 5. In consequence, a cleaning period of the wafer W can be shortened.

When the cleaning position Sb of the brush 3 reaches the position $P_1$, the brush 3 is raised by the elevating and rotating mechanism 41 to separate the brush body 43 from the wafer W. Thus, a collision between the brush 3 and the holding members 25 of the spin chuck 2 can be avoided. At the same time when the brush 3 is separated from the wafer W, the cleaning position Sn of the two-fluid nozzle 5 is moved to a portion with which the brush 3 had been in contact just before it was separated therefrom, so as to clean the peripheral part by the jet flow of the liquid droplets. If there is a possibility that the liquid droplets and the holding members 25 collide with each other to affect adversely to the wafer W, it is preferable not to bring the cleaning position Sn of the two-fluid nozzle 5 excessively close to the holding members 25. Namely, it is preferable to terminate spraying of the liquid droplets at a position where a distance from the center $P_0$ to the cleaning position Sn of the two-fluid nozzle 5 is substantially equal to a distance from the center $P_0$ to the position $P_1$.

After the brush 3 is raised from the wafer W, the rotation of the brush 3 is stopped, and the brush support arm 40 is moved from above the wafer W to the right side of the outer cup 11. Then, the peripheral part of the wafer W is cleaned by the jet flow of the liquid droplets, and the supply of the liquid droplets from the two-fluid nozzle 5 is stopped. Thereafter, the two-fluid nozzle support arm 50 is moved from above the wafer W to the left side of the outer cup 11.

After the wafer W is cleaned, the wafer W is spin-dried by rotating the same at a speed higher than that in the cleaning process. Upon completion of the spin-dry process, the spin chuck 2 is stopped, and the not-shown convey arm is let into the chamber 8 to receive the wafer W from the spin chuck 2. Then, the wafer W is unloaded from the chamber 8.

According to the substrate cleaning apparatus 1, since the liquid droplets are sprayed from the two-fluid nozzle 5 at a position nearer to the center $P_0$ than the cleaning position Sb of the brush 3, the area Ab with which the brush 3 has been in contact can be cleaned by the jet flow of the liquid droplets. Thus, even when contaminations of the brush 3 adhere to the wafer W, the contaminations adhering to the wafer W can be removed. Even in a case where the brush 3 does not contact the peripheral part of the wafer W in order not to collide with the holding members 25 of the spin chuck 2 holding the periphery of the wafer W, the peripheral part of the wafer W can be cleaned by the two-fluid nozzle 5. When a plurality of wafers W are successively cleaned, it is possible to prevent an adhesion of contaminations of the brush 3 to the wafer W. Thus, a plurality of wafer W can be cleaned in succession, without cleaning or changing the brush 3 in the course of the cleaning operation, which can improve a throughput.

An example of preferred embodiments of the present invention has been shown above, but the present invention is not limited thereto. For example, not limited to a semiconductor wafer, the substrate may be a glass substrate for an LCD, a CD substrate, a print substrate, a ceramic substrate, and so on.

Although the two-fluid nozzle 5 sprays liquid droplets of deionized water, the liquid droplets sprayed from the two-fluid nozzle 5 are not limited thereto, and may be made of a cleaning liquid other than deionized water, such as a chemical liquid. The gas to be mixed with the cleaning liquid in the two-fluid nozzle 5 may be a gas other than nitrogen gas. The structure of the two-fluid nozzle 5 is not limited to the internal mixing type as shown in the embodiment, but the two-fluid nozzle 5 may be of an external mixing type that mixes a cleaning liquid and a gas outside.

Not limited to a deionized water, a cleaning liquid supplied from the supply nozzle 7 may be a process liquid other than a deionized water, such as a chemical liquid. Although the cleaning liquid is supplied to the center $P_0$ of the wafer W, the cleaning liquid may be supplied to another position. For example, the cleaning liquid may be supplied to a position between the center $P_0$ of the wafer W and the periphery thereof.

Figure 5:
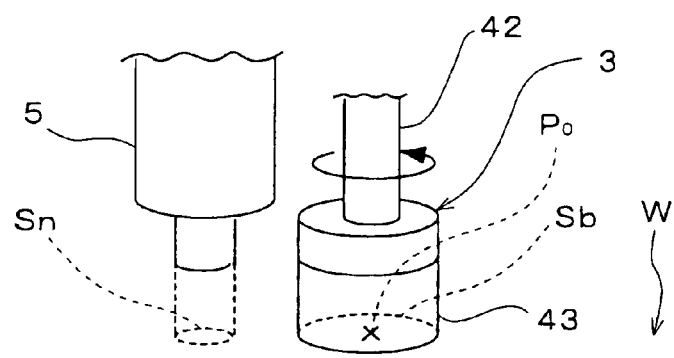
FIG. 5 is a view of assistance in explaining a modification in which a brush comes into contact with a center of a wafer while the two-fluid nozzle sprays liquid droplets.
Figure 6:
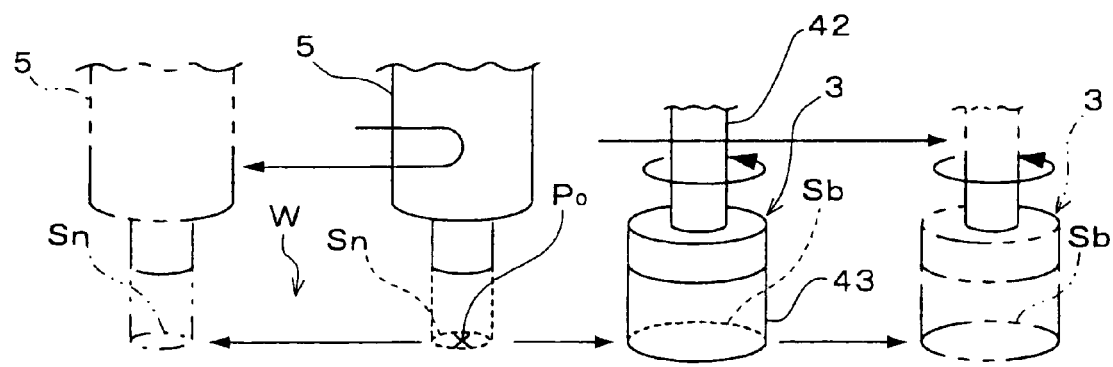
FIG. 6 is a view of assistance in explaining movements of the two-fluid nozzle and the brush, after the state shown in FIG. 5.

Alternatively, the supply of the cleaning liquid from the supply nozzle 7 may be omitted. In this case, as shown in FIG. 5, it is preferable that a cleaning operation be started under conditions that the brush 3 is brought into contact with the center $P_0$ of the rotating wafer W, while the liquid droplets are sprayed from the two-fluid nozzle 5 onto the wafer W. That is, by spraying the liquid droplets, the liquid droplets are dispersed over all the upper surface of the wafer W to form a liquid film of the cleaning liquid on the upper surface of the wafer W. Since the liquid droplets sprayed from the two-fluid nozzle 5 are dispersed and supplied to the cleaning position Sb of the brush 3 located at the center $P_0$ of the wafer W, the scrubbing operation can be suitably performed. A position of the two-fluid nozzle 5 when the brush 3 contacts the center $P_0$ of the wafer W is preferably set such that the liquid droplets are sprayed near the cleaning position Sb of the brush 3. Thus, the liquid droplets can be suitably dispersed over all the upper surface of the wafer W, and the liquid droplets can be suitably supplied to the cleaning position Sb. As shown in FIG. 6, after the brush 3 is brought into contact with the center $P_0$ of the wafer W, the movement of the brush 3 is started to move the cleaning position Sb rightward W from the center $P_0$ of the wafer W. Then, the two-fluid nozzle 5 is moved rightward to a position above the center $P_0$ so as to position the cleaning position Sn of the two-fluid nozzle 5 at the center $P_0$. Subsequently, similar to the method as described in the embodiment, while the brush 3 is moved rightward to move the cleaning position Sb toward the peripheral part of the wafer W, the two-fluid nozzle 5 is moved leftward to move the cleaning position Sn from the center $P_0$ of the wafer W toward the peripheral part thereof.

In this embodiment, during the cleaning process of the wafer W, the two-fluid nozzle support arm 50 and the two-fluid nozzle 5 are moved leftward, i.e., in an opposite direction in which the brush support arm 40 and the brush 3 are moved, so that the cleaning position Sn of the two-fluid nozzle 5 is moved leftward, while the cleaning position Sb of the brush 3 is moved rightward. However, the brush support arm 40, the brush 3, and the cleaning position Sb may not be moved in the above direction, and the two-fluid nozzle supply arm 50, the two-fluid nozzle 5, and the cleaning position Sn may not be moved in the above direction. Alternatively, for example, the moving direction of the two-fluid nozzle support arm 50, the two-fluid nozzle 5, and the cleaning position Sn may be the same as the moving direction of the brush support arm 40, the brush 3, and the cleaning position Sb.

Figure 7:
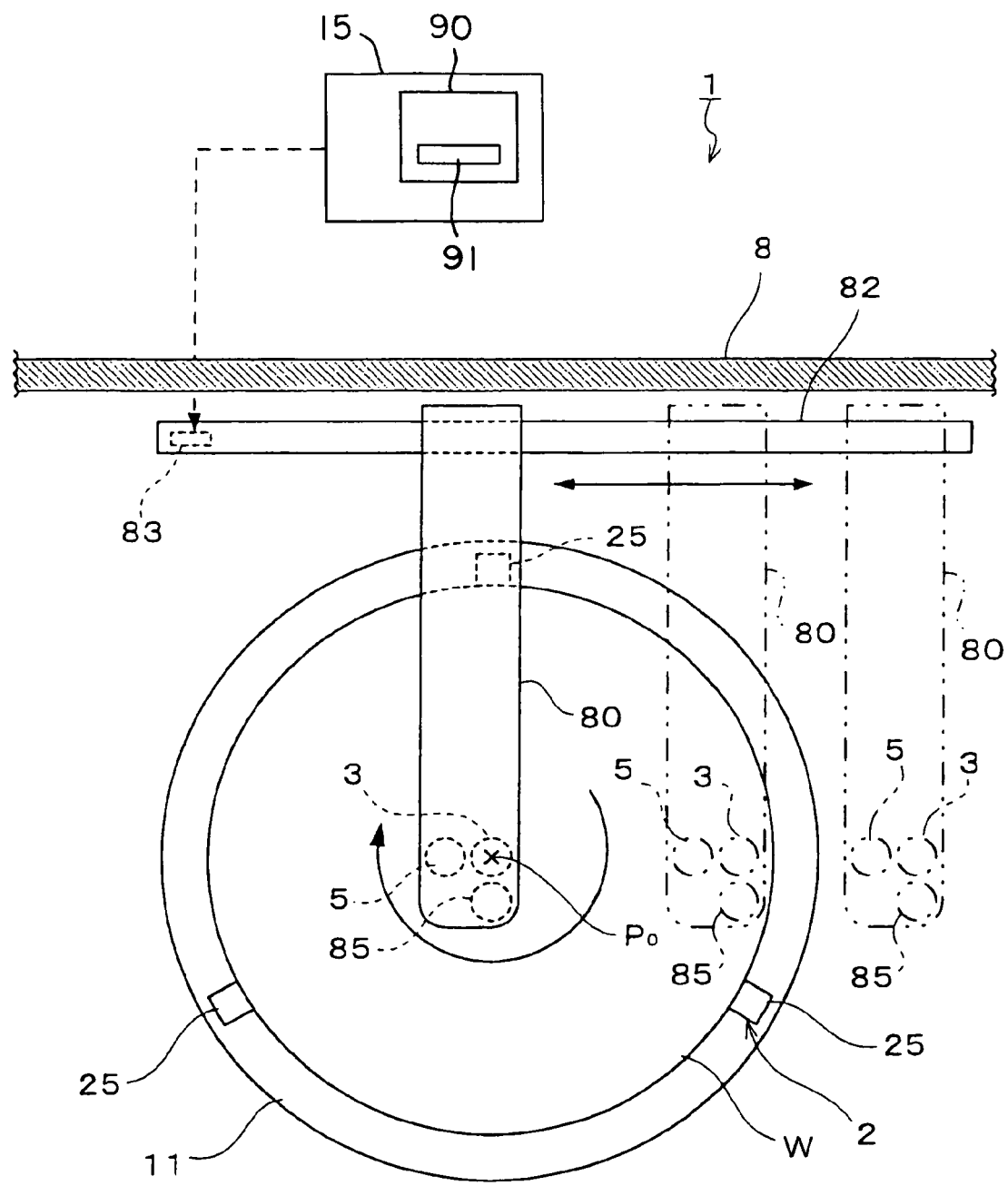
FIG. 7 is a plan view of a basic structure of a substrate cleaning apparatus in another embodiment according to the present invention.

As shown in FIG. 7, a support arm 80 may be disposed for supporting and moving a brush 3 and a two-fluid nozzle 5. In FIG. 7, a proximal end of the support arm 80 is supported by a guide rail 82 to be movable therealong. Further, a driving mechanism 83 is provided that moves the support arm 80 along the guide rail 82. Driving of the driving mechanism 83 is controlled by a controller 15, and a moving speed and a position of the support arm 80 can be changed by controlling the driving mechanism 83. The two-fluid nozzle 5 is supported by the support arm 80 such that the two-fluid nozzle 5 is arranged behind the brush 3 relative to a moving direction of the brush 3 when it is cleaning the wafer W. For example, in a case where the support arm 80 and the brush 3 are moved rightward during a cleaning operation by the brush 3, the two-fluid nozzle 5 is arranged on the left side of the brush 3. Thus, a cleaning position Sn of the two-fluid nozzle 5 can be positioned on the left side of a cleaning position Sb of the brush 3, i.e., at a position nearer to the center $P_0$ than the cleaning position Sb. Further, it is preferable to dispose on the support arm 80 a second two-fluid nozzle 85 behind the brush 3 relative to a rotational direction of the wafer W. Due to the provision of the second two-fluid nozzle 85, immediately after the peripheral part of the wafer W is cleaned by the brush 3, it is possible to spray the liquid droplets from the second two-fluid nozzle 85 behind the brush 3 to clean the peripheral part of the wafer W. When the brush 3 is separated from the wafer W, the cleaning operation by the second two-fluid nozzle 85 can be finished. That is, the liquid droplets can be sprayed onto the peripheral part of the wafer W immediately after the cleaning operation by the brush 3 is terminated, without moving the support arm 80. Thus, the wafer W can be effectively cleaned, so that a throughput can be enhanced. Further, only one support arm 80 is used, the structure and the control can be simplified.

The above operations are executed by the controller 15 having a control computer 90 with a recording medium 91 in which a control software is recorded. Since details of the recording medium 91 are the same as those of the recording medium 91 described with reference to FIGS. 1 and 2, the description thereof is omitted.

The moving direction of the two-fluid nozzle 5 and its cleaning position Sn and the moving direction of the brush 3 and its cleaning position Sn may not be aligned, but may be arranged at a certain angle. Furthermore, the moving direction of the two-fluid nozzle 5 and the cleaning position Sn of the two-fluid nozzle 5 and the moving direction of the brush 3 and the cleaning position Sb of the brush 3 may not be linear. Means for moving the two-fluid nozzle 5 and the brush 3 are not limited to the brush support arm 40, the two-fluid nozzle support arm 50, and the guide rails 60 and 61. For example, an arm that supports the brush 3 and swings above the wafer W may be disposed, and the cleaning position Sb of the brush 3 may be moved in a swinging manner on the upper surface of the wafer W from the center $P_0$ toward the peripheral part. An arm that supports the two-fluid nozzle 5 and swings above the wafer W may be disposed, and the cleaning position Sn of the two-fluid nozzle 5 may be moved in a swinging manner on the upper surface of the wafer W from the center $P_0$ toward the peripheral part. Alternatively, an arm that supports the brush 3 and the two-fluid nozzle 5 and swings above the wafer W may be disposed, the arm supporting the two-fluid nozzle 5 behind the brush 3 relative to a moving direction of the brush 3 which cleans the wafer W. The cleaning position Sb of the brush 3 and the cleaning position Sn of the two-fluid nozzle 5 may be moved in a swinging manner on the upper surface of the wafer W from the center $P_0$ toward the peripheral part.

In this embodiment, the brush 3 is brought into contact with the center $P_0$ of the wafer W, and the movement of the cleaning position Sb of the brush 3 is started from the center $P_0$ of the wafer W. However, the wafer W may be cleaned by the brush 3 from behind the center $P_0$ thereof in the moving direction of the brush 3. That is, the cleaning position Sb of the brush 3 may be moved from behind the center $P_0$ in the moving direction of the cleaning position Sb. In this embodiment, the liquid droplets is sprayed by the two-fluid nozzle 5 from the center $P_0$ of the wafer W, and the cleaning position Sn of the two-fluid nozzle 5 is moved from the center $P_0$ of the wafer W. However, the wafer W may be cleaned by the two-fluid nozzle 5 from behind the center $P_0$ thereof in the moving direction of the two-fluid nozzle 5. That is, the cleaning position Sn of the two-fluid nozzle 5 is moved from behind the center $P_0$ in the moving direction of the cleaning position Sn. In this manner, the center $P_0$ of the wafer W can be more reliably cleaned.

In this embodiment, in order to prevent a collision between the holding members 25 of the spin chuck 2 and the brush 3, the cleaning position Sb of the brush 3 is moved up to a position nearer to the center $P_0$ than the peripheral edge of the wafer W. However, when there is no possibility that the holding members 25 of the spin chuck 2 and the brush 3 collide with each other, in a case where the lower surface of the wafer W is absorbed and held by the spin chuck, for example, the cleaning position Sb of the brush 3 may be moved up to the periphery of the wafer W to scrub the overall upper surface of the wafer W.

An experiment was conducted to examine a cleaning effect of the wafer W, as an Example of the cleaning method according to the embodiment of the present invention. In this Example, rear surfaces of five wafers W were cleaned in succession. Before and after the cleaning process, the number of particles adhering to the rear surface of the fifth wafer W was measured. Then, a removal ratio of particles was calculated. The wafer W used in this Example was held by an electrostatic chuck with its rear surface facing downward in an etching apparatus for performing a dry etching. Particles adhered to the overall rear surface of the wafer W. As shown in Table 1, the result shows that the removal ratio of particles is about 95.1%. Thus, it was confirmed that contaminations were sufficiently removed from the overall rear surface of the wafer W.

Comparative Example 1

A comparative experiment was conducted to clean an overall rear surface of a wafer W by scrubbing the rear surface of the wafer W by using only a brush, and then spraying a deionized water as a cleaning liquid from a high-pressure jet nozzle. Five wafers W were consecutively cleaned by this cleaning method. Before and after the cleaning process, the number of particles adhering to the rear surface of the fifth wafer W was measured. Similar to the above Example, the wafer W used in this Comparative Example 1 was held by an electrostatic chuck with its rear surface facing downward in an etching apparatus for performing a dry etching. Particles adhered to the overall rear surface of the wafer W. Cleaning conditions, such as a rotational speed and a moving speed of the brush and a scrubbing period by the brush, were the same as those in the Example. As shown in Table 1, the experiment result shows that a removal ratio of particles is about 88.0%. Thus, it was confirmed that the cleaning method of Comparative Example 1 is inferior to the cleaning method of Example in the contamination removal performance. Particularly, it was found that particles were prone to remain around a center part of the wafer W.

Comparative Example 2

A comparative experiment was conducted in which a rear surface of a wafer W was scrubbed by using only a brush. Five wafers W were consecutively cleaned by this cleaning method. Before and after the cleaning process, the number of particles adhering to the rear surface of the fifth wafer W was measured. Similar to the above Example, the wafer W used in this Comparative Example 2 was held by an electrostatic chuck with its rear surface facing downward in an etching apparatus for performing a dry etching. Particles adhered to the overall rear surface of the wafer W. Cleaning conditions, such as a rotational speed and a moving speed of the brush and a scrubbing period by the brush, were the same as those in Example and Comparative Example 1. As shown in Table 1, the experiment result shows that a removal ratio of particles is about 85.5%. Thus, it was confirmed that the cleaning method of Comparative Example 2 is inferior to the cleaning method of Example and Comparative Example 1 in the contamination removal performance. Particularly, it was found that particles were prone to remain around a center part of the wafer W.

TABLE 1

|  | Removal Ratio (%) |
| --- | --- |
| Example | 95.1 |
| Comparative Example 1 | 88.0 |
| Comparative Example 2 | 85.5 |

Figure 8:
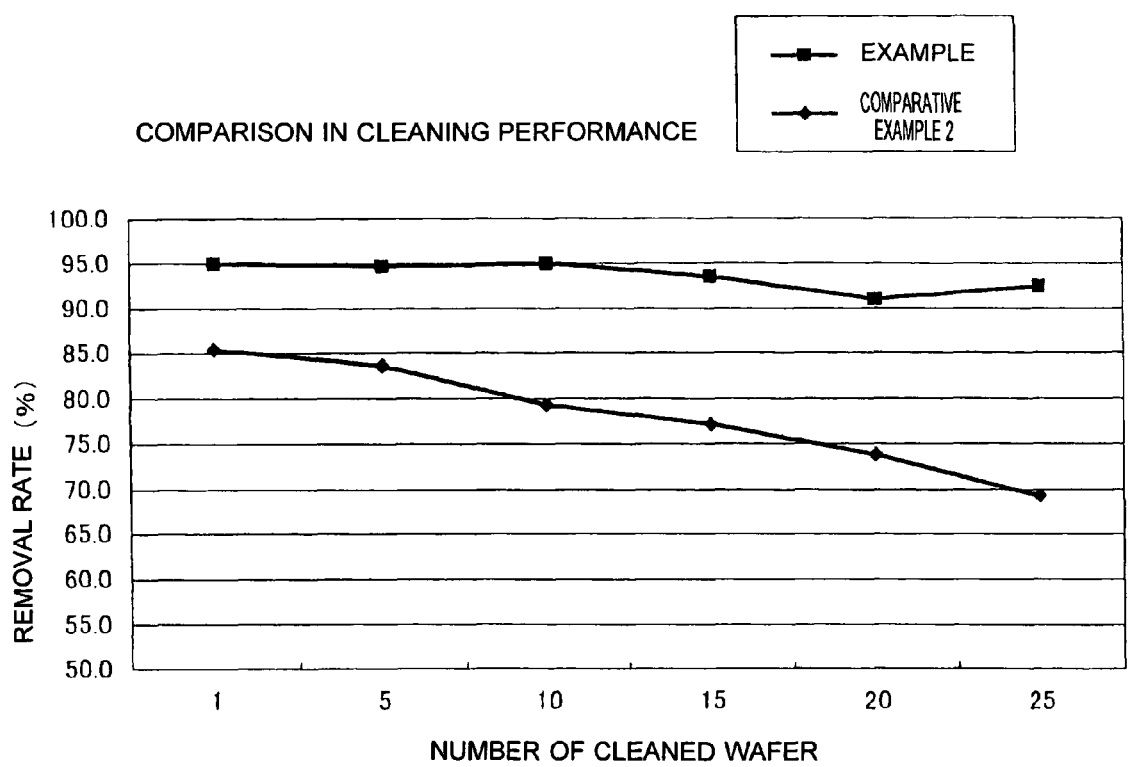
FIG. 8 is a graph showing a relationship between the number of wafers to be cleaned and a removal ratio of particles in Example and Comparative Example 2.

In addition, rear surfaces of 25 wafers W were consecutively cleaned in accordance with the cleaning methods shown in Example and Comparative Example 2, respectively, and variations in removal ratios of particles were examined for each cleaning methods. As shown in FIG. 8, the result shows that the cleaning method of Example has a higher removal ratio than that of the cleaning method of Comparative Example 2. In particular, in the cleaning method of Comparative Example 2, as the number of wafers W to be cleaned is increased, the removal ratio is lowered. On the other hand, in the cleaning method of Example, the removal ratio hardly varies, even when the number of wafers W to be cleaned is increased. As a result, it was confirmed that, according to the present invention, when the cleaning operations of the wafer W are repeatedly performed, a deterioration in cleaning performance can be prevented.

The invention claimed is:

1. A substrate cleaning method for cleaning a substrate by bringing a brush into contact with the substrate while rotating the same, and by spraying liquid droplets from a two-fluid nozzle onto the substrate, wherein
   the brush and the two-fluid nozzle are moved radially outward relative to a center of the substrate, while a cleaning position of the two-fluid nozzle is kept nearer to the center of the substrate than a cleaning position of the brush,
   the cleaning position of the brush and the cleaning position of the two-fluid nozzle are moved in directions opposite to each other,
   the cleaning position of the two-fluid nozzle is moved radially outward to a periphery of the substrate relative to the center of the substrate to areas where the brush has been in contact with the substrate,
   a moving speed of the cleaning position of the two-fluid nozzle relative to the substrate is higher than a moving speed of the cleaning position of the brush relative to the substrate, and
   a difference between a distance from the center of the substrate to the cleaning position of the brush and a distance from the center of the substrate to the cleaning position of the two-fluid nozzle becomes gradually smaller, as the cleaning position of the brush approaches the periphery of the substrate.

2. The substrate cleaning method according to claim 1, wherein
   the brush is brought into contact with the center of the substrate, while spraying liquid droplets from the two-fluid nozzle onto the substrate, and the cleaning position of the brush is started to move radially outward from the center of the substrate, and thereafter the cleaning position of the two-fluid nozzle is positioned above the center of the substrate to move radially outward from the center of the substrate.

3. The substrate cleaning method according to claim 1 or 2, wherein
   after the brush is separated from the substrate at a peripheral part thereof, the cleaning position of the two-fluid nozzle is moved to a position above a portion with which the brush had been in contact immediately before the brush was separated therefrom.

4. The substrate cleaning method according to claim 1 or 2, wherein
the moving speed of the cleaning position of the brush relative to the substrate and the moving speed of the cleaning position of the two-fluid nozzle relative to the substrate are reduced, as the cleaning position of the brush and the cleaning position of the nozzle move radially outward from the center of the substrate.

5. A substrate cleaning method for cleaning a substrate by bringing a brush into contact with the substrate while rotating the same, and by spraying liquid droplets from a two-fluid nozzle onto the substrate, wherein
the brush and the two-fluid nozzle are moved radially outward relative to a center of the substrate, while a cleaning position of the two-fluid nozzle is kept nearer to the center of the substrate than a cleaning position of the brush,
a moving speed of the cleaning position of the two-fluid nozzle relative to the substrate is higher than a moving speed of the cleaning position of the brush relative to the substrate, and
a difference between a distance from the center of the substrate to the cleaning position of the brush and a distance from the center of the substrate to the cleaning position of the two-fluid nozzle becomes gradually smaller, as the cleaning position of the brush approaches a peripheral part of the substrate.

6. A medium for recording a program that allows a computer to execute the procedures of bringing a brush into contact with a substrate while rotating the same, and spraying liquid droplets from a two-fluid nozzle onto the substrate, wherein
the brush and the two-fluid nozzle are moved radially outward relative to a center of the substrate, while a cleaning position of the two-fluid nozzle is kept nearer to the center of the substrate than a cleaning position of the brush,
the cleaning position of the brush and the cleaning position of the two-fluid nozzle are moved in directions opposite to each other,
the cleaning position of the two-fluid nozzle is moved radially outward to a periphery of the substrate relative to the center of the substrate to areas where the brush has been in contact with the substrate,
a moving speed of the cleaning position of the two-fluid nozzle relative to the substrate is higher than a moving speed of the cleaning position of the brush relative to the substrate, and
a difference between a distance from the center of the substrate to the cleaning position of the brush and a distance from the center of the substrate to the cleaning position of the two-fluid nozzle becomes gradually smaller, as the cleaning position of the brush approaches the periphery of the substrate.

7. The medium according to claim 6, wherein
the program allows a computer to execute the procedure of bringing the brush into contact with the center of the substrate, while spraying liquid droplets from the two-fluid nozzle onto the substrate, and starting the cleaning position of the brush to move radially outward from the center of the substrate, and thereafter positioning the cleaning position of the two-fluid nozzle above the center of the substrate to move the same position radially outward from the center of the substrate.

8. The medium according to claim 6 or 7, wherein
the program allows a computer to execute the procedures of separating the brush from the substrate at a peripheral part thereof, and thereafter moving the cleaning position of the two-fluid nozzle to a position above a portion with which the brush had been in contact immediately before the brush was separated therefrom.

9. The medium according to claim 6 or 7, wherein
the program allows a computer to execute the procedure of reducing the moving speed of the cleaning position of the brush relative to the substrate and the moving speed of the cleaning position of the two-fluid nozzle relative to the substrate, as the cleaning position of the brush and the cleaning position of the nozzle move radially outward from the center of the substrate.

10. A medium for recording a program that allows a computer to execute the procedures of bringing a brush into contact with a substrate while rotating the same, and spraying liquid droplets from a two-fluid nozzle onto the substrate, wherein
the brush and the two-fluid nozzle are moved radially outward relative to a center of the substrate, while a cleaning position of the two-fluid nozzle is kept nearer to the center of the substrate than a cleaning position of the brush,
the program allows a computer to execute the procedure of controlling a moving speed of the cleaning position of the two-fluid nozzle relative to the substrate to be higher than a moving speed of the cleaning position of the brush relative to the substrate, and
a difference between a distance from the center of the substrate to the cleaning position of the brush and a distance from the center of the substrate to the cleaning position of the two-fluid nozzle becomes gradually smaller, as the cleaning position of the brush approaches a peripheral part of the substrate.

* * * * *